United States Patent
Conner

(10) Patent No.: US 6,879,175 B2
(45) Date of Patent: Apr. 12, 2005

(54) HYBRID AC/DC-COUPLED CHANNEL FOR AUTOMATIC TEST EQUIPMENT

(75) Inventor: George W. Conner, Los Gatos, CA (US)

(73) Assignee: Teradyne, Inc., Boston, MA (US)

(*) Notice: Subject to any disclaimer, the term of this patent is extended or adjusted under 35 U.S.C. 154(b) by 73 days.

(21) Appl. No.: 10/404,900

(22) Filed: Mar. 31, 2003

(65) Prior Publication Data

US 2004/0189339 A1 Sep. 30, 2004

(51) Int. Cl.[7] .............................................. G01R 31/26
(52) U.S. Cl. .................................... 324/765; 324/713
(58) Field of Search ............................... 324/158.1, 759, 324/763, 764, 765, 672, 674, 679, 681, 750, 522

(56) References Cited

U.S. PATENT DOCUMENTS 6,331,783 B1 * 12/2001 Hauptman .................. 324/765
6,661,242 B1 * 12/2003 Cascella ..................... 324/713

* cited by examiner

Primary Examiner—David Zarneke
Assistant Examiner—Trung Q. Nguyen
(74) Attorney, Agent, or Firm—Teradyne Legal Department

(57) ABSTRACT

A channel for use in automatic test equipment and adapted for coupling to a device-under-test is disclosed. The channel includes a driver and respective AC and DC-coupled signal paths. The AC-coupled signal path is disposed at the output of the driver and is configured to propagate signal components at and above a predetermined frequency. The DC-coupled signal path is disposed in parallel with the AC-coupled signal path and is configured to propagate signal components from DC to the predetermined frequency.

12 Claims, 2 Drawing Sheets

HYBRID AC/DC-COUPLED CHANNEL FOR AUTOMATIC TEST EQUIPMENT

FIELD OF THE INVENTION

The invention relates generally to automatic test equipment, and more particularly pin electronics channel architectures for automatic test equipment applications.

BACKGROUND OF THE INVENTION

Test is an important step in the manufacture of semiconductor devices. The automatic test equipment (ATE) employed to carry out this task comprises sophisticated electronics capable of sending test signals to, and capturing output signals from, one or more devices under test (DUTs). This back and forth flow of signals is orchestrated by ATE channel hardware, typically referred to as "channels". There is often a one-to-one correspondence between the ATE channels and DUT I/O pins.

Until recently, ATE channels were predominantly DC-coupled to the device-under-test. DC-coupling allows for both DC and AC test signals to propagate between the ATE and the DUT. However, because of the technology differences between the DUT and the tester pin electronics drivers, significant DC offsets were common. DC offsets can undesirably affect accuracy in the application and detection of signals with defined logic levels. This problem was often solvable by merely adjusting threshold voltage levels with the conventional ATE drivers so that the DC offset at the driver matched that of the DUT receiver.

While the DC-coupling scheme worked fine for its intended low-speed applications, modern communications devices deal with very fast signals having very small voltage swings. Unlike the older (and slower) conventional pin electronics drivers optimized for relatively large voltage swings, the ATE drivers implemented to interface with high-speed communications devices have limited DC offset adjustment capability, if any at all. To alleviate this problem, the tester channel may be AC-coupled to the device, removing any DC signal components from the channel signal path.

Recently, semiconductor devices that were typically tested via DC-coupled ATE channels, such as microprocessors, have begun implementing communications technology that benefits from an AC-coupled channel. However, many of the pins of those devices also benefit from a DC-coupled channel. While a high-speed AC data stream may be tested on a conventional DC-coupled channel, a long series of "0"s or "1s" may cause a drift in the DC offset. This has the potential to undesirably affect the tester accuracy.

Consequently, the need exists for an ATE channel architecture that may be reliably and accurately employed for the transmission and reception of broadband signals ranging from DC up to the tens of gigahertz. The hybrid AC/DC-Coupled channel architecture of the present invention satisfies this need.

SUMMARY OF THE INVENTION

The channel architecture of the present invention provides a unique way of optimizing tester flexibility by providing both DC and AC-coupled signal paths in the channel hardware. The paths are automatically selected based on the frequency of the signals propagating between the tester and the DUT.

To realize the foregoing advantages, the invention in one form comprises a channel for use in automatic test equipment and adapted for coupling to a device-under-test. The channel includes a driver and respective AC and DC-coupled signal paths. The AC-coupled signal path is disposed at the output of the driver and is configured to propagate signal components at and above a predetermined frequency. The DC-coupled signal path is disposed in parallel with the AC-coupled signal path and is configured to propagate signal components from DC to the predetermined frequency.

In a further form, the invention comprises a method of interfacing automatic test equipment to a device-under-test. The method includes the steps of first AC-coupling the automatic test equipment to the device-under-test along an AC-coupled signal path for signal components at and above a predetermined frequency, and DC-coupling the automatic test equipment to the device-under-test along a DC-coupled signal path for signal components from DC to the predetermined frequency.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
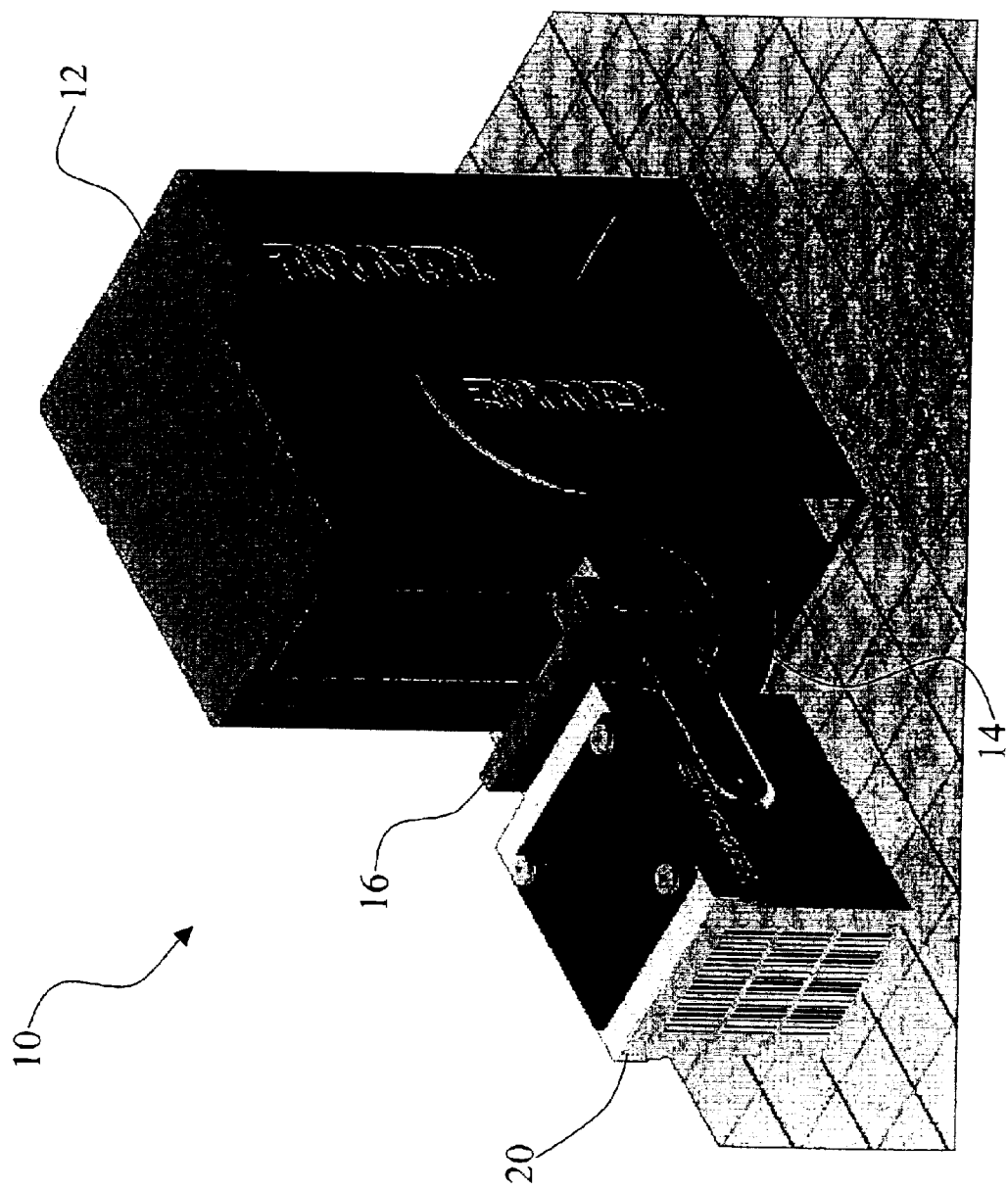
FIG. 1 is an elevated perspective view of a semiconductor tester.

Referring now to FIG. 1, a semiconductor tester in accordance with one form of the present invention, generally designated 10, includes a main console 12 to house various electronic sub-assemblies that support the operation of a plurality of tester instruments (not shown) disposed in a testhead 20. The testhead couples to the console via a cable bundle 14 and serves as an extension of the tester in an effort to place the tester instruments as close to one or more devices-under-test (DUTs) (FIG. 2, 32) as possible. A manipulator 16 disposed adjacent the console carries and positions the testhead with respect to a handling apparatus (not shown), such as a packaged-device handler or wafer prober. A sophisticated interface assembly (not shown) connects the testhead to the DUT via an arrangement of coaxial cables, circuit boards, and wafer probes (or, for packaged device testing, sockets).

The tester instrument boards, often referred to as "channel cards", are adapted for installation within the testhead 20 and resemble large rectangular circuit boards. Each channel card may provide hardware and software resources for anywhere from sixteen to sixty-four channels. The cards may comprise digital instruments such as waveform digitizers, digital signal generators, analog instruments such as RF signal generators and other analog waveform analyzers, memory test instrumentation or the like. With this in mind, the present invention is directed to a channel architecture that suits high performance analog instrument applications.

Figure 2:
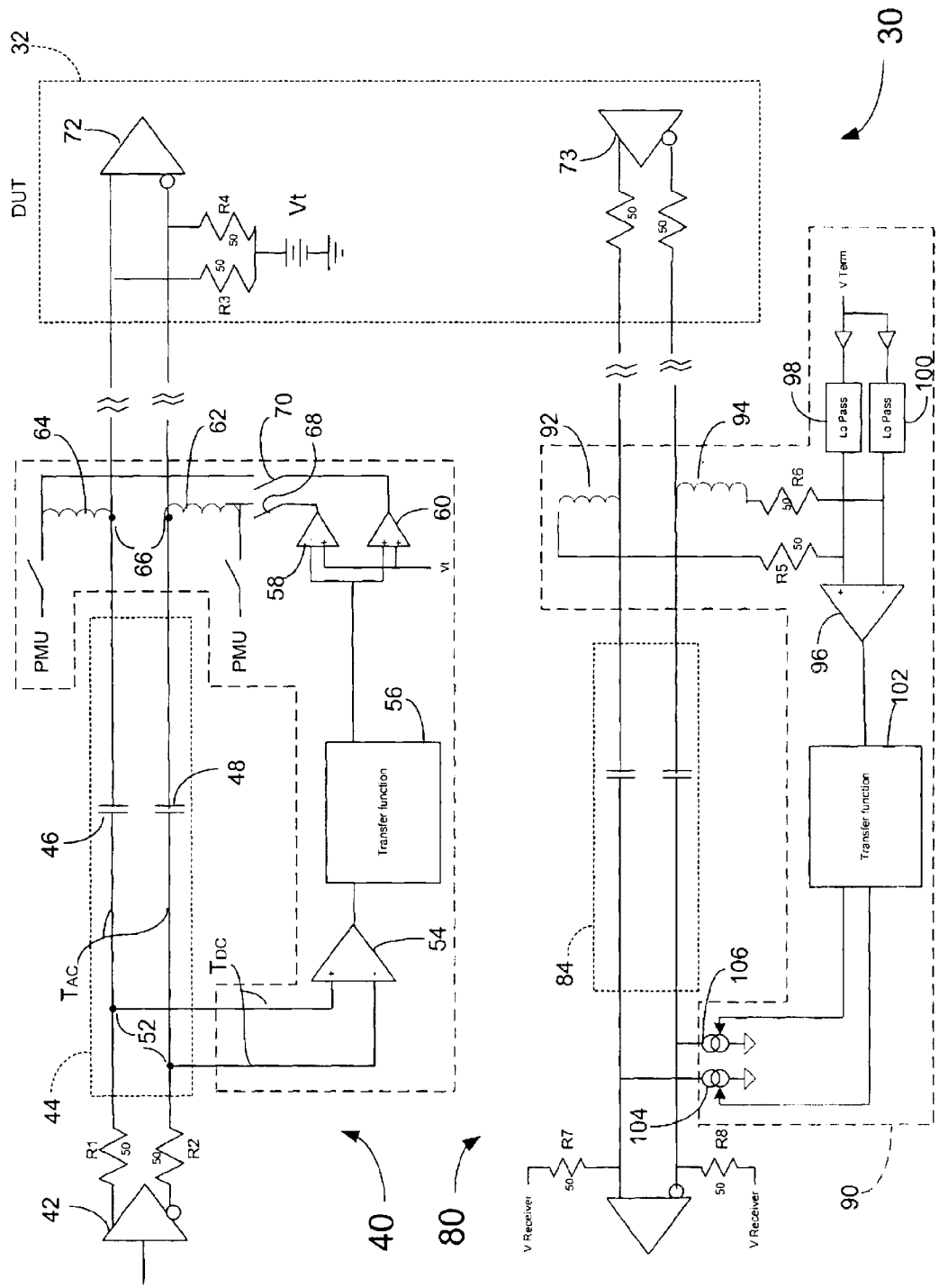
FIG. 2 is a high-level block diagram of a channel architecture employed in the semiconductor tester of FIG. 1, according to one form of the present invention.

With reference now to FIG. 2, the channel architecture of the present invention provides a way to optimize tester accuracy and flexibility for semiconductor device manufacturers. This is accomplished by providing a channel configuration that includes both AC and DC-coupled paths 44 and 50. The paths are disposed in parallel and automatically direct signal components therealong depending on the frequency of the components.

Further referring to FIG. 2, the channel architecture according to one form of the present invention, generally designated 30, includes a driver circuit 40 and a comparator circuit 80. The driver circuit includes a high-speed differential driver 42 (or transmitter) preferably capable of generating broadband signals from DC to twenty Ghz. A suitable driver for this application is the model TMOD110 differential transmitter, manufactured by Agere, Inc.

Connected directly to the output of the driver 42, the AC-coupled signal path 44 includes a differential transmission line $T_{AC}$ suitable for propagating AC signal components at and above a predetermined frequency, such as 300 KHz. Signal components at frequencies below the predetermined target are blocked, or filtered. To carry out this functionality, the AC-coupled path includes respective DC blocking capacitor circuits 46 and 48. The driver output resistance (represented by a pair of fifty-ohm resistors R1 and R2) is configured to match the characteristic impedance of the AC-coupled and DC-coupled signal path transmission lines $T_{AC}$ and $T_{DC}$.

As noted above, the capacitor circuits 46 and 48 are preferably configured to form a differential high-pass filter that effectively blocks frequencies below the predetermined target frequency (for example, 300 KHz). Capacitance configurations resulting in overall capacitances of around 0.05 microfarads to 0.10 microfarads have been found suitable for this application. Terminating the end of the AC-coupled transmission line $T_{AC}$, at the DUT 32, are a pair of termination resistors R3 and R4 configured to match the characteristic impedance of the transmission line (in this case, fifty ohms).

With continuing reference to FIG. 2, the DC-coupled path 50 complements the AC-coupled path 44 by forming a parallel route for signals propagating at frequencies ranging from DC to around 300 Khz. This parallel construction enables a waveform having a broad frequency spectrum at the output of the driver 42 to be preserved at the input to the DUT receiver 72 with the exception of a DC offset voltage.

Like the AC-coupled path 44, the DC-coupled path 50 connects to the output of the driver 42 to form a differential node at 52. The node feeds the inputs of a buffer amplifier 54 that generates an output signal suitable for transformation by a low-pass filter circuit 56 (defined by a predetermined transfer function). The transfer function is defined such that the phase and frequency of the DC-coupled signal components remain preserved at the output of the DC-coupled path with only a DC offset.

The output of the filter circuit 56 is directed to a pair of single-ended buffers 58 and 60 that are configured to cooperatively generate a differential output signal. A pair of inductors 62 and 64 interface the differential buffer output signal to an output node at 66 via a selector comprising respective switches 68 and 70. The switches are user-programmable to allow the user flexibility in selecting between AC-coupling the DUT to the tester, or allowing both AC and DC-coupled paths to operate simultaneously for waveforms having broad frequency spectrums. The output node 66 serves as the output interface connection to a DUT receiver circuit 72.

In a preferred embodiment, a pair of parametric measurement units PMU1 and PMU2, are switchably coupled to the output node via the inductors 62 and 64. The PMUs allow for DC-related measurements during testing of the DUT 32, as is well-known in the art.

Further referring to FIG. 2, the comparator circuit 80 is formed similar to the driver circuit 40, but centers on a comparator 82, or receiver to accurately detect output signals generated by the DUT 32 in response to the tester driver circuit. A suitable comparator, for example, is the model TRCV0110g receiver, available from Agere, Inc. Like the driver circuit, the comparator circuit includes an AC-coupled path 84 and a DC-coupled path 90. However, whereas the driver circuit 40 forced a voltage to the DUT 32, the comparator circuit preferably allows for the DUT to drive a current back to the tester comparator (or receiver), as more fully described below.

In an effort to simplify the comparator circuitry 80 and maximize signal detection accuracy, the inventor has determined that injecting a current into the comparator 82 is more desirable than forcing a voltage, as is preferably done on the driver side of the channel. This is due in large part to the "floating" nature of the high-speed differential receiver that relies on a common-mode termination scheme to preserve a fifty-ohm environment along the transmission line.

With continued reference to FIG. 2, the comparator DC-coupled path 90 includes a pair of inductors 92 and 94 that are resistively coupled to the inputs of a buffer amplifier 96 through respective fifty-ohm resistors R5 and R6. A pair of low-pass filters 98 and 100 are also connected to the amplifier inputs and provide a termination to a termination voltage Vterm at low frequencies. Preferably the low-pass filters are constructed with off-the-shelf op amp circuitry (well-known to those skilled in the art). The output of the amplifier is transformed by a transfer function defined by an appropriate filter 102, and used (with its complement to form a differential signal) as the control inputs to a pair of current sources 104 and 106. The current sources, in turn, feed the differential inputs to the comparator 82.

In operation, the tester instrument directs the generation of test signals by the driver circuit 40 ranging from DC (zero Hz) to 20 GHz. Test signal generation by the instrument is programmably controlled by the user, as is the choice of whether to AC-couple the tester to the DUT, or have both AC-coupling and DC-coupling operative simultaneously (for waveforms having broad frequency spectrums). High-speed signal components at or above 300 KHz propagate along the AC-coupled path 44 and pass unaffected through the high-pass filter created by the capacitor circuits 46 and 48. The high-speed signal components may then be received at the DUT receiver 72 without any DC signal component complications.

For instances where the driver circuit 40 generates test signal components from DC to 300 KHz, the capacitor circuits 46 and 48 along the AC-coupled path 44 block the signals therealong. The DC-coupled path takes over by transforming the signal via the buffer 54 and filter 56 in an effort to correct for any potential DC offsets between the driver circuit 40 and the DUT receiver 72. The resulting signal is then fed to the single-ended drivers, merged into a differential signal, and fed to the input of the DUT receiver.

The output responses from the DUT transmitter 73 are detected along the AC and DC-coupled paths 84 and 90 in the comparator circuit 80. As is the case with the driver circuit 40, signal components at or above a predefined frequency such as 300 KHz propagate along the AC-coupled path 84, while the low-end frequency signal components are directed along the DC-coupled path 90. The DC-coupled path provides a suitable termination voltage Vterm, as seen by the DUT transmitter 73, via the inductors 92 and 94 and the low-pass filter circuits 98 and 100.

Once the DC signal components are transformed by the filter 102, they provide control signals for the inputs to the current sources 104 and 106. By injecting current into the fifty-ohm resistances R7 and R8 coupled to the tester comparator 82, a suitable termination voltage can be established.

Those skilled in the art will recognize the many benefits and advantages afforded by the present invention. Of significant importance is the implementation of both AC-coupled and DC-coupled signal paths in a channel architecture. This offers the device manufacturer unparalleled flexibility in coupling the tester to his devices so that accuracy and performance are optimized. By merely programming the instrument, the device manufacturer has the ability to AC-couple the tester to his device, or AC and DC-couple it.

While the invention has been particularly shown and described with reference to the preferred embodiments thereof, it will be understood by those skilled in the art that various changes in form and detail may be made therein without departing from the spirit and scope of the invention. For example, wile the inventor's preferred scheme in the comparator circuit is to drive a current into the comparator during operation, forcing a voltage is an acceptable alternative and within the scope of the present invention.

What is claimed is:

1. A channel for use in automatic test equipment and adapted for coupling to a device-under-test, the channel including:

a driver circuit;

a first AC-coupled signal path disposed at the output of the driver circuit and configured to propagate signal components at and above a predetermined frequency; and a first DC-coupled signal path disposed at the output of the driver circuit in a parallel relationship with the first AC-coupled signal path and configured to propagate signal components from DC to the predetermined frequency.

2. A channel according to claim 1 and further including:

a user-programmable selector to establish either the AC-coupled signal path, or both the AC and DC-coupled signal paths in operation.

3. A channel according to claim 1 wherein:

the DC-coupled signal path includes a filter operative on the signal components from DC to the predetermined frequency according to a predefined transfer function, the transfer function preserving the phase and frequency of the signal components from DC to the predetermined frequency, and offsetting any DC voltage component by a predetermined amount.

4. A channel according to claim 1 and further including:

a comparator circuit;

a second AC-coupled signal path disposed at the comparator input and configured to propagate signal components at and above a predetermined frequency; and a second DC-coupled signal path disposed at the comparator input in a parallel relationship with the second AC-coupled signal path and configured to propagate signal components from DC to the predetermined frequency.

5. A channel for use in automatic test equipment and adapted for coupling to a device-under-test, the channel including:

a comparator;

a second AC-coupled signal path disposed at the comparator input and configured to propagate signal components at and above a predetermined frequency; and a second DC-coupled signal path disposed in parallel with the AC-coupled signal path and configured to propagate signal components from DC to the predetermined frequency.

6. A channel according to claim 5 and further including:

a user-programmable selector to establish either the AC-coupled signal path or both the AC and DC-coupled signal paths in operation.

7. A channel according to claim 5 wherein:

the second DC-coupled signal path includes a current injection circuit.

8. A channel for use in automatic test equipment and adapted for coupling to a device-under-test, the channel including:

means for driving a differential signal;

means for AC-coupling the means for driving a differential signal to the device-under-test; and means for DC-coupling the means for driving a differential signal to the device-under-test.

9. A channel according to claim 8 and further including:

means for selecting for operation either the means for AC-coupling or both the means for AC-coupling and the means for DC-coupling.

10. A channel according to claim 8 wherein the means for DC-coupling includes:

a filter operative on the signal components from DC to the predetermined frequency according to a predefined transfer function, the transfer function preserving the phase and frequency of the signal components from DC to the predetermined frequency, and offsetting any DC voltage component by a predetermined amount.

11. A channel according to claim 8 and further including:

means for comparing a differential signal to a reference signal;

means for AC-coupling the means for comparing to the device-under-test; and means for DC-coupling the means for comparing to the device-under-test.

12. A channel according to claim 8 wherein the means for DC-coupling includes:

means for injecting a current into the means for comparing.

* * * * *